United States Patent
Sun et al.

(10) Patent No.: US 12,072,396 B2
(45) Date of Patent: Aug. 27, 2024

(54) MECHANICALLY DRIVEN SMR-BASED MEMS MAGNETOELECTRIC ANTENNAS

(71) Applicant: Northeastern University, Boston, MA (US)

(72) Inventors: Nian-Xiang Sun, Winchester, MA (US); Neville Sun, Boston, MA (US); Xianfeng Lian, Boston, MA (US); Huaihao Chen, Boston, MA (US)

(73) Assignee: Northeastern University, Boston, MA (US)

( * ) Notice: Subject to any disclaimer, the term of this patent is extended or adjusted under 35 U.S.C. 154(b) by 114 days.

(21) Appl. No.: 17/656,761

(22) Filed: Mar. 28, 2022

(65) Prior Publication Data

US 2022/0308125 A1    Sep. 29, 2022

Related U.S. Application Data

(60) Provisional application No. 63/166,960, filed on Mar. 26, 2021.

(51) Int. Cl.
| | | |
|---|---|---|
| *G01R 33/028* | (2006.01) | |
| *H03H 9/135* | (2006.01) | |
| *H03H 9/17* | (2006.01) | |

(52) U.S. Cl.
CPC ......... *G01R 33/0286* (2013.01); *H03H 9/135* (2013.01); *H03H 9/175* (2013.01)

(58) Field of Classification Search
CPC  G01R 33/00; G01R 33/0035; G01R 33/0023; G01R 33/0017; G01R 31/3191;
(Continued)

(56) References Cited

U.S. PATENT DOCUMENTS

| | | | | |
|---|---|---|---|---|
| 2011/0291231 | A1* | 12/2011 | Jiang | ........................ H01L 28/10 257/E21.705 |
| 2014/0125432 | A1* | 5/2014 | Stephanou | ......... H03H 9/02149 29/25.35 |

(Continued)

OTHER PUBLICATIONS

Aigner, R. et al., "Behavior of BAW devices at high power levels", IEEE MTT-S International Microwave Symposium Digest, 2005, pp. 429-432.

(Continued)

*Primary Examiner* — Jermele M Hollington
*Assistant Examiner* — Taqi R Nasir
(74) *Attorney, Agent, or Firm* — Hamilton, Brook, Smith & Reynolds, P.C.

(57) ABSTRACT

A solidly mounted resonator (SMR)-based magnetoelectric (ME) antenna comprises a substrate, a Bragg reflector disposed on the substrate, a magnetostrictive/piezoelectric ME composite element disposed on the Bragg reflector, a first electrically conductive contact and a second electrically conductive contact. The first contact is disposed between the Bragg reflector and the magnetostrictive/piezoelectric ME composite element and electrically coupled to a bottom surface of the magnetostrictive/piezoelectric ME composite element. The second contact is disposed on top of the magnetostrictive/piezoelectric ME composite element and electrically coupled to the top of the magnetostrictive/piezoelectric ME composite element. The magnetostrictive/piezoelectric ME composite element comprises a magnetorestrictive multilayer deposited on a piezoelectric layer. The magnetorestrictive multilayer produces an in-plane uniaxial magnetic anisotropy (UMA). The UMA is a twofold UMA that exhibits a symmetric radiation pattern.

20 Claims, 15 Drawing Sheets
(13 of 15 Drawing Sheet(s) Filed in Color)

(58) Field of Classification Search
CPC .... G01R 33/0286; G01B 7/004; G01C 17/38; G06F 3/017; G06F 3/0346; G06F 3/012; H03H 9/135; H03H 9/175
See application file for complete search history.

(56) References Cited

U.S. PATENT DOCUMENTS

| | | | | |
|---|---|---|---|---|
| 2016/0087186 | A1* | 3/2016 | Burak | H03H 9/02228 310/366 |
| 2020/0059215 | A1* | 2/2020 | Woolsey | H03H 9/02118 |

OTHER PUBLICATIONS

Bickford, J. A. et al., "Low Frequency Mechanical Antennas: Electrically Short Transmitters from Mechanically-Actuated Dielectrics", 2017 IEEE Symposium on Antennas and Propagation, Jul. 2017, pp. 1475-1476.

Bickford, J. A. et al., "Performance of Electrically Small Conventional and Mechanical Antennas", IEEE Transactions on Antennas and Propagation, vol. 67, Apr. 2019, No. 4, pp. 2209-2223.

Buell, K. et al., "A Substrate for Small Patch Antennas Providing Tunable Miniaturization Factors", IEEE Transactions on Microwave Theory and Techniques, vol. 54, No. 1, Jan. 2006, pp. 135-146.

Burch, H. C. et al., "Experimental Generation of ELF Radio Signals Using a Rotating Magnet", IEEE Transactions on Antennas and Propagation, 2018, pp. 1-8.

Cannata, D., "Nerve agent simulant detection by solidly mounted resonators (SMRs) polymer coated using laser induced forward transfer (LIFf) technique", Sensors and Actuators B, vol. 173, 2012, pp. 32-39.

Chen, H. et al., "Integrated Tunable Magnetoelectric RF Inductors", IEEE Transactions on Microwave Theory and Techniques, vol. 68, No. 3, Mar. 2020, pp. 951-963.

Chen, H. et al., "Ultra-compact mechanical antennas", Applied Physics Letters, vol. 117, Issue 17, Oct. 2020, pp. 170501-1-170501-9.

Choe, G. et al., "Surface roughness effects on magnetoresistive and magnetic properties of NiFe thin films", Journal of Applied Physics, vol. 85, No. 8, Apr. 15, 1999, pp. 5777-5779.

Chu, Z. et al., "A low-power and high-sensitivity magnetic field sensor based on converse magnetoelectric effect", vol. 115, 2019, pp. 162901, 1-5.

Dong, C. et al., "A Portable Very Low Frequency (VLF) Communication System Based on Acoustically Actuated Magnetoelectric Antennas", IEEE Antennas and Wireless Propagation Letters, vol. 19, Issue 3, Jan. 22, 2020, pp. 1-5.

Gianvittorio, J.P. et al., "Fractal Antennas: A Novel Antenna Miniaturization Technique, and Applications", IEEE Antennas and Propagation Magazine, vol. 44, No. 1, Feb. 2002, pp. 20-36.

He, Y. et al., "A Novel Dual-Band, Dual-Polarized, Miniaturized and Low-Profile Base Station Antenna", IEEE Transactions on Antennas and Propagation, vol. 63, No. 12, Dec. 2015, pp. 5399-5408.

Hong, W. et al., "Multibeam Antenna Technologies for 5G Wireless Communications", IEEE Transactions on Antennas and Propagation, vol. 65, No. 12, Dec. 2017, pp. 6231-6249.

Hong, W. et al., "Study and Prototyping of Practically Large-Scale mmWave Antenna Systems for 5G Cellular Devices", IEEE Communications Magazine, Sep. 2014, pp. 63-69.

Kaajakari, V. et al., "Nonlinear Limits for Single-Crystal Silicon Microresonators", Journal of Microelectromechanical Systems, vol. 13, No. 5, Oct. 2004, 1 page.

Kiourti, A. et al., "A Review of Implantable Patch Antennas for Biomedical Telemetry: Challenges and Solutions", IEEE Antennas and Propagation Magazine, vol. 54, No. 3, Jun. 2012, pp. 210-228.

Kiourti, A., "A Review of In-Body Biotelemetry Devices: Implantables, Ingestibles, and Injectables", IEEE Transactions on Biomedical Engineering, vol. 64, No. 7, Jul. 2017, pp. 1422-1430.

Li, M. et al., "Effect of surface roughness on magnetic properties of Co films on plasma-etched Si(100) substrates", Journal of Applied Physics, vol. 83, No. 10, May 15, 1998, 1 page.

Li, M. et al., "Highly-sensitive DC magnetic field sensor based on nonlinear ME effect", IEEE Sensors Letters, vol. 2, No. 3, 2017, 4 pages.

Liang, X, et al., "A Review of Thin-Film Magnetoelastic Materials for Magnetoelectric Applications", Sensors, vol. 20, 2020, 1532, pp. 1-27.

Liang, X. et al., "Novel Acoustically Actuated Magnetoelectric Antennas", Novel Acoustically Actuated Magnetoelectric Antennas, Jul. 2018, pp. 2189-2190.

Lizzi, L. et al., "Design of Miniature Antennas for IoT Applications", 2016 IEEE Sixth International Conference on Communications and Electronics (ICCE), Sep. 8, 2016, pp. 234-237.

Marrocco, G. et al., "The Art of UHF RFID Antenna Design: Impedance-Matching and Size-Reduction Techniques", IEEE Antennas and Propagation Magazine, vol. 50, No. 1, Feb. 2008, pp. 66-79.

Nakamura, K. et al., "Theoretical Analysis of A Piezoelectric Thin Film Resonator With Acoustic Quarter-Wave Multilayers", IEEE International Frequency Control Symposium, 1998, pp. 876-881.

Nan, C. W. et al., "Multiferroic magnetoelectric composites: Historical perspective, status, and future directions", Journal of Applied Physics, vol. 103, 2008, 031101, 1-35.

Nan, T. et al., "Acoustically actuated ultra-compact NEMS magnetoelectric antennas", Nature Communications, vol. 8. Article No. 296, 2017, pp. 1-8.

Newell, W. E. "Face-Mounted Piezoelectric Resonators", Proceedings of the IEEE, Jun. 1965, pp. 575-581.

Nosek, J., "Drive Level Dependence of the Resonant Frequency in BAW Quartz Resonators and His Modeling", IEEE Transactions on Ultrasonics, Ferroelectrics, and Frequency Control, vol. 46, No. 4, Jul. 1999, pp. 823-829.

Ruby, R. et al., "Thin Film Bulk Wave Acoustic Resonators (FBAR) for Wireless Applications", 2001 IEEE Ultrasonics Symposium. Proceedings. An International Symposium, 2001, 13 pages.

Scarpello, M. L., et al., "Design of an Implantable Slot Dipole Conformal Flexible Antenna for Biomedical Applications", IEEE Transactions on Antennas and Propagation, vol. 59, Issue 10, Oct. 2011, pp. 1-9.

Schmidhammer, E. "Nonlinear Effects in Acousto-Electric Devices", 2008 4th European Conference on Circuits and Systems for Communications, 2008, pp. 221-226.

Selvin, S. et al., "Spinning Magnet Antenna for VLF Transmitting", 2017 IEEE International Symposium on Antennas and Propagation & USNC/URSI National Radio Science Meeting, 2022, pp. 1477-1478.

Skrivervik, A. K. et al., "PCS Antenna Design: The Challenge of Miniaturization", IEEE Antennas and Propagation Magazine, vol. 43, No. 4, Aug. 2001, pp. 12-27.

Srinivasan, G. et al., "Magnetoelectric Composites", Annual Rev. Mater. Res., vol. 40, 2010, pp. 153-178.

Sun, N. X. et al., "Voltage Control of Magnetism in Multiferroic Heterostructures and Devices", SPIN, vol. 2, No. 3, 2012, 1240004-1-1240004-46.

Tu , C. et al., "A passive isolator realized by magnetoelectric laminate composites ", Applied Physics Letters, vol. 113, 2018, pp. 262904, 1-4.

Villa-Lopez, F.H. et al., "Design and Modelling of Solidly-Mounted Resonators for Low-Cost Particle Sensing", Measurement Science and Technology, vol. 27, No. 2, 2015, pp. 1-16.

Volakis, J. L., et al., "Small Antennas: Miniaturization Techniques & Applications", Dec. 22, 2009, 8 pages.

Wang, J. et al., "Magnetostriction, Soft Magnetism, and Microwave Properties in Co—Fe—C Alloy Films", American Physical Society, vol. 12, 034011, Sep. 9, 2019, 37 pages.

Wang, Y. S. et al., "Two PIFA-Related Miniaturized Dual-Band Antennas", IEEE Transactions on Antennas and Propagation, vol. 55, No. 3, Mar. 2007, pp. 805-806.

Wheeler, H. A., "Fundamental Limitations of Small Antennas", Proceedings of The I.R.E., vol. 35, Issue 12, Dec. 1947, pp. 1479-1484.

(56) References Cited

OTHER PUBLICATIONS

Yao, Z., "Bulk Acoustic Wave-Mediated Multiferroic Antennas: Architecture and Performance Bound", IEEE Transactions on Antennas and Propagation, vol. 63, No. 8, Aug. 2015, pp. 3335-3344.

* cited by examiner $R_0 = 0.11\ \Omega$; $C_0 = 14.5$ pF; $R_s = 9.0\ \Omega$;

$R_m = 6.64\ \Omega$; $L_m = 71.1$ nH; $C_m = 117.4$ fF

MECHANICALLY DRIVEN SMR-BASED MEMS MAGNETOELECTRIC ANTENNAS

RELATED APPLICATION

This application claims the benefit of U.S. Provisional Application No. 63/166,960, filed on Mar. 26, 2021. The entire teachings of the above application are incorporated herein by reference.

GOVERNMENT SUPPORT

This invention was made with government support under W9113M-19-C-0063 from the Department of Defense. The government has certain rights in the invention.

BACKGROUND

Mechanically driven antennas have been demonstrated to be the most effective method to miniaturize antennas among state-of-the-art compact antennas. The magnetoelectric (ME) antennas based on a released magnetostrictive/piezoelectric heterostructure rely on electromechanical resonance instead of electromagnetic wave resonance, which results in an antenna size as small as one-thousandth of an electromagnetic wavelength. Such microelectromechanical systems (MEMS) devices, however, are very fragile due to their suspended structure.

Free-standing thin-film bulk acoustic resonator (FBAR) membrane and solidly mounted resonator (SMR) are two principal geometric structures for bulk acoustic wave (BAW) devices to confine acoustic energy in the piezoelectric material. To generate a mechanical resonance, an isolating structure preventing absorption in the neighboring media is required to build up a strong standing wave. The acoustic isolation of ME antennas based on the FBAR and SMR structure is created by the air gap and the Bragg reflector, respectively. A disadvantage of FBAR structures is the fragile anchors that holds the resonating plate. The anchors can fracture under external collisions and can be sensitive to the film stress during fabrication. On the other hand, the SMR structure is fabricated by utilizing an all planar process without substrate etching or any suspended structures, which provides better mechanical properties and can be easily packaged and integrated with integrated circuits (ICs). This Bragg reflector comprises alternating layers of low and high acoustic impedance materials. The energy leakage is largely prohibited by the reflection of acoustic waves at each interface of the multilayer stack due to the acoustic impedance mismatch.

SUMMARY

The described embodiments are directed to an SMR-based magnetoelectric (ME) antenna configured to reduce energy loss by returning the vertically propagating energy from the Bragg reflector to the acoustic resonator.

In one aspect, the invention may be A solidly mounted resonator (SMR)-based magnetoelectric (ME) antenna that comprises a substrate, a Bragg reflector disposed on the substrate, a magnetostrictive/piezoelectric ME composite element disposed on the Bragg reflector, a first electrically conductive contact disposed between the Bragg reflector and the magnetostrictive/piezoelectric ME composite element and electrically coupled to a bottom surface of the magnetostrictive/piezoelectric ME composite element, and a second electrically conductive contact disposed on top of the magnetostrictive/piezoelectric ME composite element and electrically coupled to a top surface of the magnetostrictive/piezoelectric ME composite element.

In an embodiment, the Bragg reflector may comprise alternating layers of high acoustic impedance materials and low acoustic impedance materials. The high acoustic impedance layers may be tungsten (W), and the low acoustic impedance layers may be silicon dioxide ($SiO_2$). The alternating layers may further comprise three layers of high acoustic impedance materials and three layers of low acoustic impedance materials.

The first electrically conductive contact and the second electrically conductive contact may be constructed and arranged to provide an electrical impedance match to a transmission line that couples the SMR-based ME antenna to a receiver or to a transmitter. The first electrically conductive contact may be platinum (Pt) and the second electrically conductive contact may be gold (Au).

The magnetostrictive/piezoelectric ME composite element may comprise a magnetorestrictive multilayer deposited on a piezoelectric layer. The magnetorestrictive multilayer may comprise FeGaB and $SiO_2$, and the piezoelectric layer may comprise ZnO. The magnetorestrictive multilayer may produce an in-plane uniaxial magnetic anisotropy (UMA). The UMA may be a twofold UMA that exhibits a symmetric radiation pattern. The magnetostrictive/piezoelectric ME composite element may be patterned to exhibit a specific radiation pattern.

In another aspect, the invention may be a method of fabricating a solidly mounted resonator (SMR)-based magnetoelectric (ME) antenna comprising providing a silicon substrate, depositing a Bragg reflector on the silicon substrate, depositing at least one bottom electrode on the Bragg reflector, depositing a ZnO film on the bottom electrode and the Bragg reflector, depositing a top electrode on the ZnO film, and depositing a FeGaB/SiO2 multilayer on the top electrode and the ZnO film.

In an embodiment, depositing a Bragg reflector on the silicon substrate may further comprise sputtering alternating layers of tungsten (W) and silicon dioxide (SiO2) on the substrate. The sputtering of the W layers may be performed with DC sputtering and the sputtering of the $SiO_2$ layers may be performed with RF reactive magnetron sputtering. Sputtering alternating layers of W and $SiO_2$ may further comprise sputtering three layers of W and three layers of $SiO_2$. The method may further comprise applying an in-situ magnetic field bias, perpendicular to the anchor direction of the device, while depositing the FeGaB/$SiO_2$ multilayer on the top electrode and the ZnO film. The method ma further comprise providing a silicon substrate that has a resistivity of at least 10,000 Ω·cm In another aspect, the invention may be a transceiver system comprising a solidly mounted resonator (SMR)-based magnetoelectric (ME) antenna, an impedance matcher coupled to the SMR-based ME antenna, a transceiver having one or both of a receiver component and a transmitter component, and a transmission line having (i) a first end electrically coupled to the impedance matcher and (ii) a second end electrically coupled to the transceiver.

The impedance matcher may be an impedance matching network comprising one or more components configured to cause a match between an antenna impedance at the SMR-based ME antenna and a transceiver impedance at the transceiver. The impedance matcher may be a configuration of the first and second electrically conductive contacts tailored to cause match between an antenna impedance at magnetostrictive/piezoelectric ME composite element and a transceiver impedance at the transceiver.

In an embodiment, the SMR-based ME antenna may exhibit a symmetric directional antenna gain pattern.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

Figure 1A:
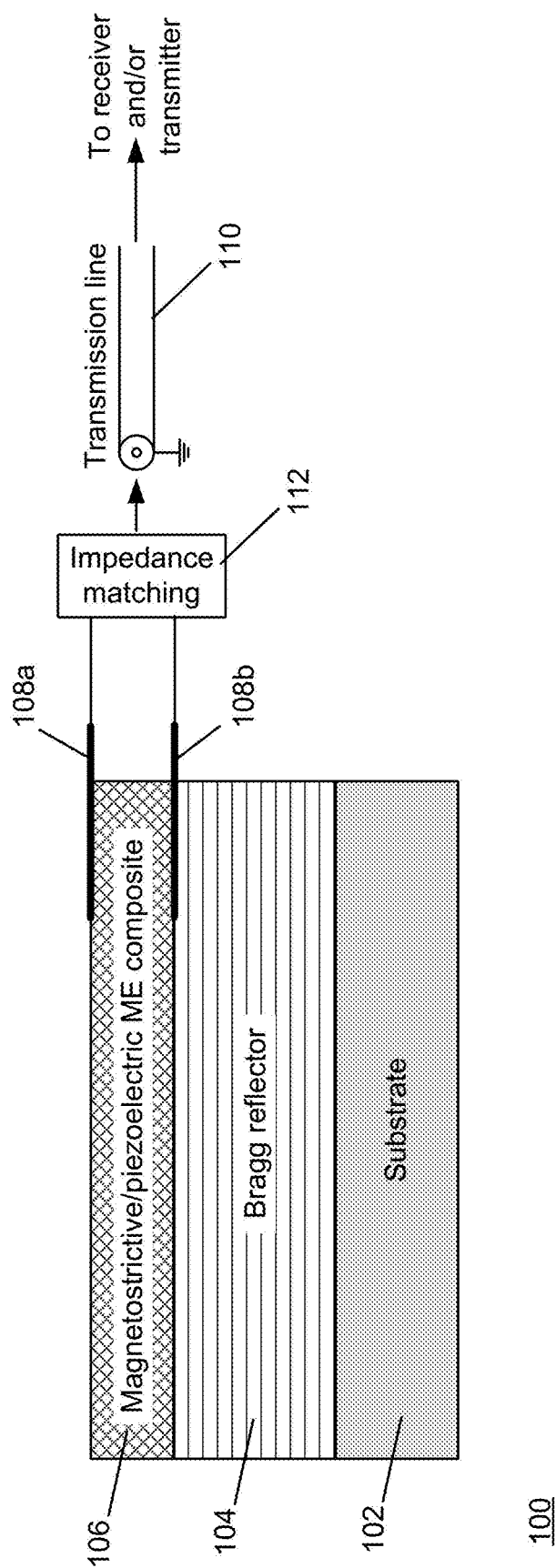
FIG. 1A illustrates a simplified cross-sectional view of an example embodiment of an SMR-based ME antenna according to the invention.

The described embodiments of the invention are directed to a solidly mounted resonator (SMR)-based magnetoelectric (ME) antenna. FIG. 1A illustrates a simplified cross-sectional view of an example embodiment of an SMR-based ME antenna according to the invention. The example SMR-based ME antenna 100 may include a substrate 102, a Bragg reflector 104, a magnetostrictive/piezoelectric ME composite element 106, and electrical contacts 108a, 108b. The substrate 102 may be high-resistivity (HR) silicon, although other substrate materials known in the art may alternatively be used. The Bragg reflector 104, which is disposed upon the substrate 102, may comprise alternating layers of low acoustic impedance and high acoustic impedance materials. The magnetostrictive/piezoelectric ME composite element 106 is disposed upon the Bragg reflector, and sandwiched between the electrical contacts 108a, 108b. As described in more detail herein, the ME composite element 106 may be in the form of a disk, although other shapes may alternatively be used. The electrical contacts may be electrically coupled to a transmission line 110 or other electrical conductors suitable for conveying an electrical signal to the electrical contacts 108a, 108b (e.g., from a transmitter) or from the electrical contacts 108a, 108b (e.g., from a receiver), or both. The example embodiment may further include impedance matching 112 between the contacts 108a, 108b and the transmission line 110. The impedance matching 112 may comprise components that form a matching network between the contacts 108a, 108b and the transmission line 110. Alternatively, the matching network may comprise a suitable configuration of the electrical connection between the contacts 108a, 108b to the transmission line that results in a continuous transition from the impedance of the contacts 108a, 108b to the impedance of the transmission line 110.

Figure 1B:
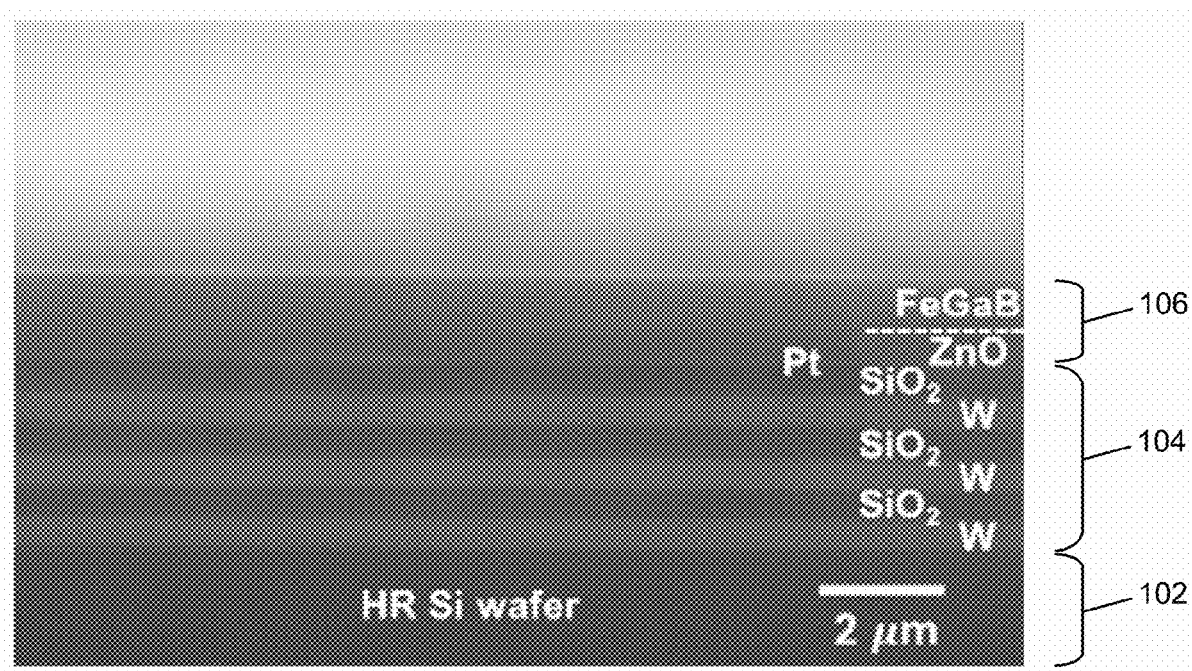
FIG. 1B illustrates a cross-sectional scanning electron microscopy (SEM) image of an example embodiment of an SMR-based magnetoelectric (ME) antenna according to the invention.
Figure 1C:
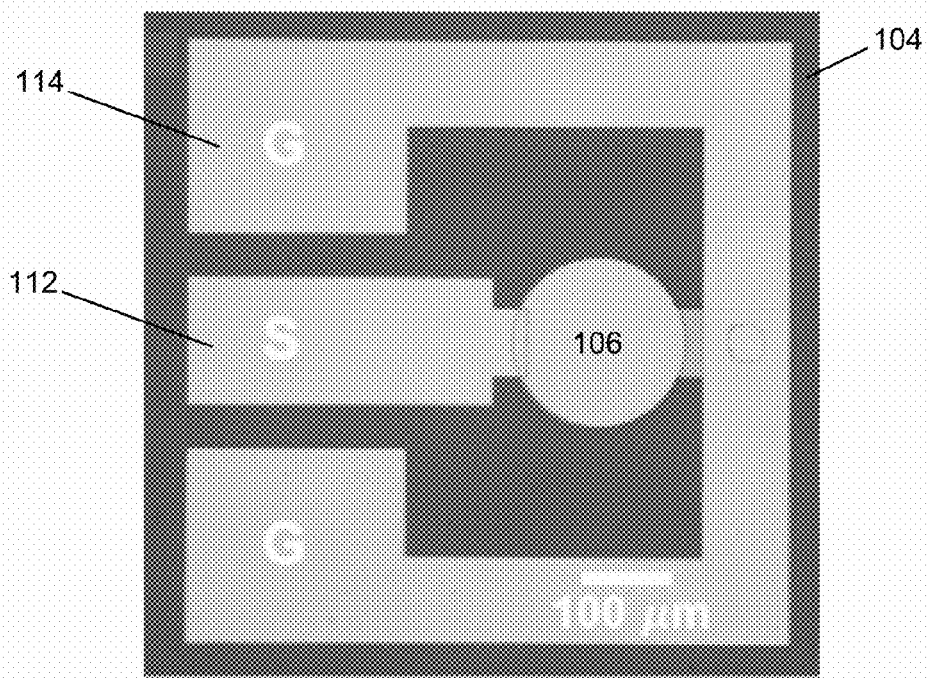
FIG. 1C illustrates an optical image of the example embodiment of the SMR-based ME antenna according to the invention.
Figure 1D:
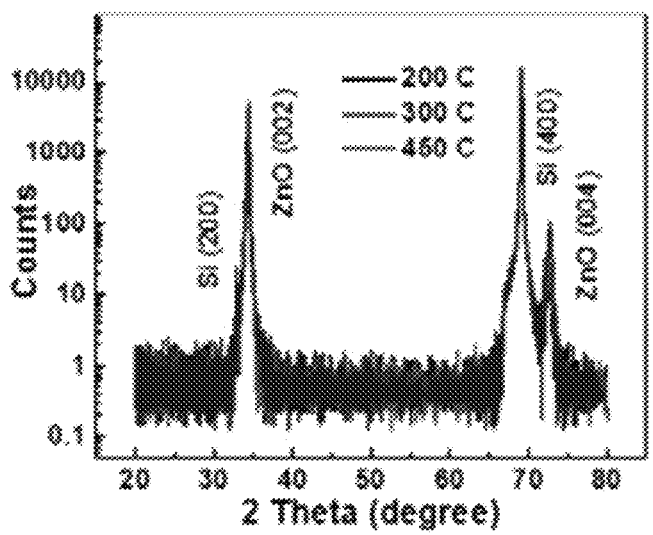
FIGS. 1D-1I show x-ray diffraction (XRD) and full width at half maximum (FWHM) data for different processing parameters.
Figure 1E:
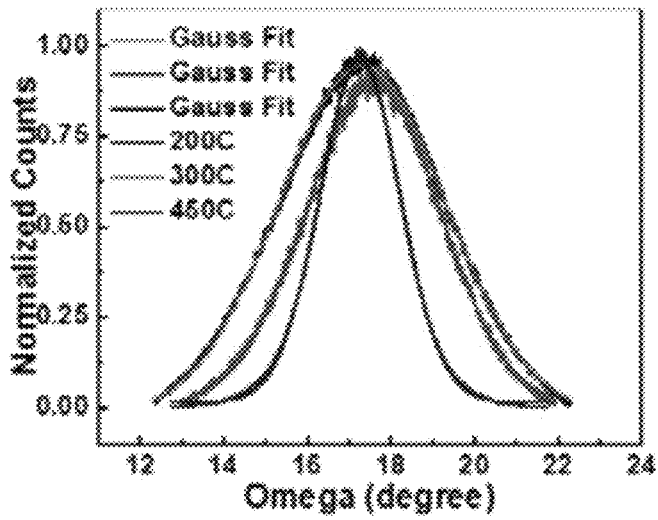
Figure 1F:
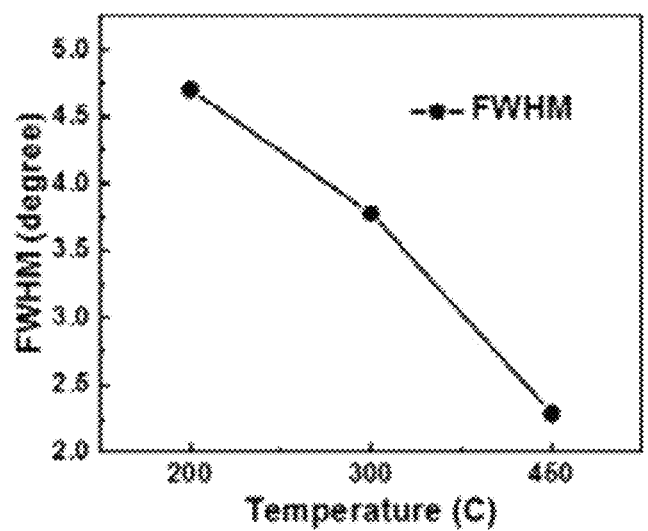
Figure 1G:
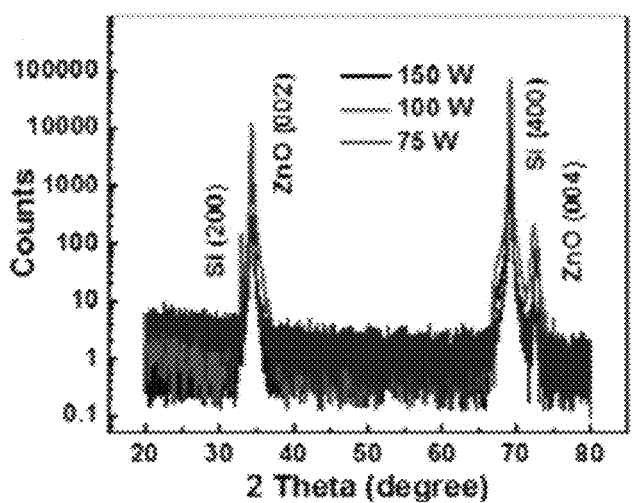
Figure 1H:
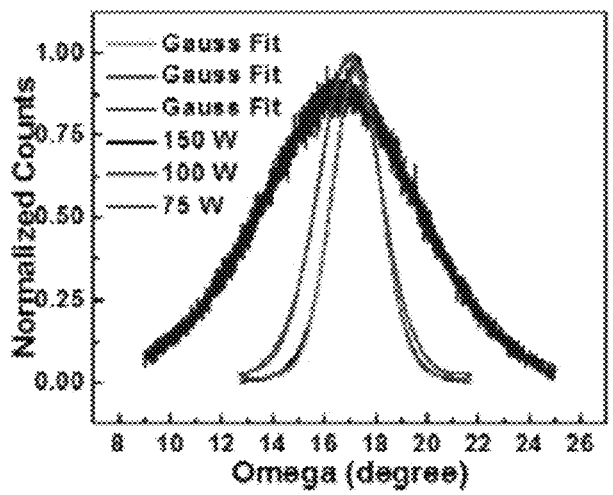
Figure 1I:
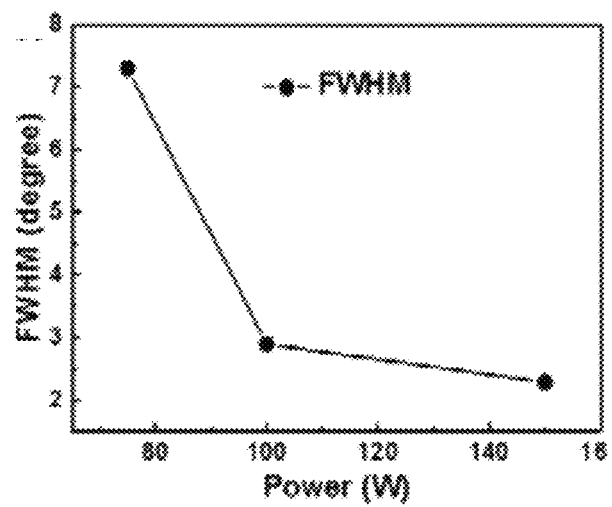

FIG. 1B illustrates a cross-sectional scanning electron microscopy (SEM) image of an example embodiment of an SMR-based magnetoelectric (ME) antenna according to the invention. A 2 µm reference bar is shown for scale. FIG. 1C illustrates an optical image of the example embodiment of the SMR-based ME antenna. A 100 µm reference bar is shown for scale. FIGS. 1B and 1C illustrate the excellent film quality of the Bragg reflector and the ME composite of the example embodiment. The signal (S) pad 112 and ground ring (G) structure 114 correspond to the electrical contacts 108a, 108b shown in FIG. 1A that may be used to feed an RF signal into the SMR-based ME antenna or convey an electrical signal (received by the antenna. In some embodiments, the electrical contacts are constructed and arranged to accomplish an impedance match to a transmission line to increase the coupling efficiency to a receiver and/or from a transmitter.

The microstructure, crystal orientation, and piezoelectric properties of ZnO thin films are greatly influenced by sputtering conditions. We investigated the effects of RF plasma power, sputtering gas pressure, oxygen ($O_2$) flux density and temperature on the crystal orientation of ZnO films. ZnO films with high c-axis orientation are achieved by carefully optimizing the process parameters. During the development of ZnO films, samples were deposited on the Si substrate and evaluated by x-ray diffraction (XRD) and the full width at half maximum (FWHM) of the rocking curve analyzed at the (002) peak. By varying the RF plasma power, deposition temperature, $O_2$ gas flux density, and sputtering pressure, we converged on a set of process parameters that resulted in the ZnO film sample that met our design goals. The XRD and FWHM data for different plasma power and temperature with unchanged $O_2$ flux density of 5 standard cubic centimeters per minute (SCCM) and sputtering pressure of 3 mT are shown in FIGS. 1D-1I. The (002) peak of ZnO and smallest FWHM is about 34.4° and 2.29°, respectively, which indicates good film quality with high c-axis orientation. All other samples are amorphous without any ZnO XRD peaks that were discovered. The intrinsic stress is generally one of the most important characteristic for thin-film free floating membrane ME devices, but stress optimization was not necessary, due to the inherent durability of SMR devices.

Figure 2A:
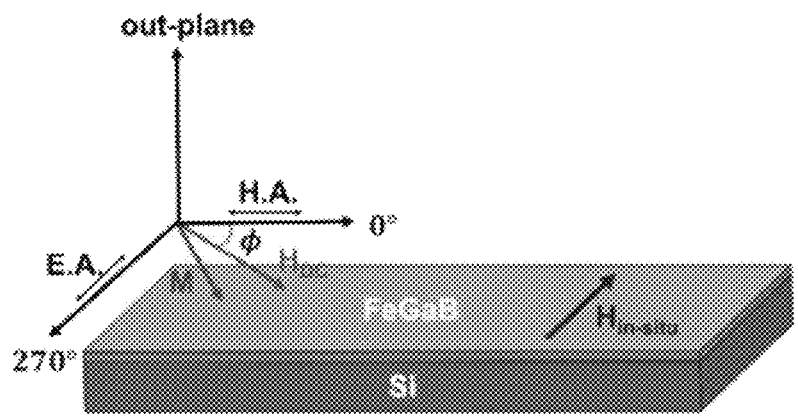
FIGS. 2A-2H show characterization of various magnetic properties of FeGaB and $SiO_2$ multilayers.
Figure 2B:
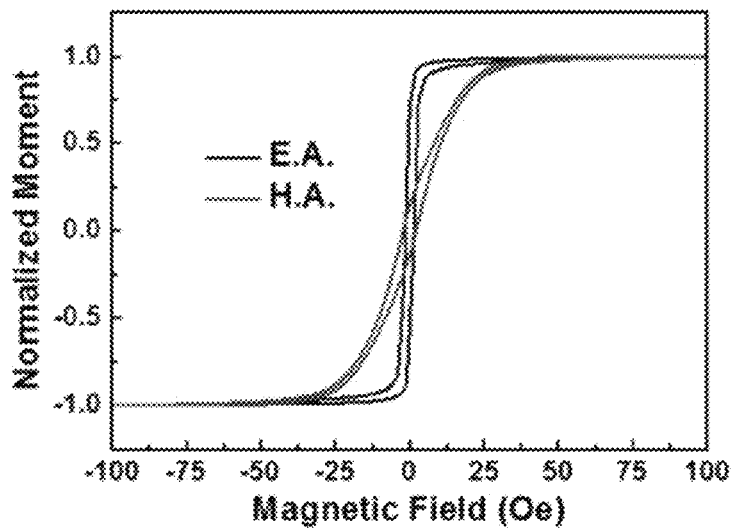
Figure 2C:
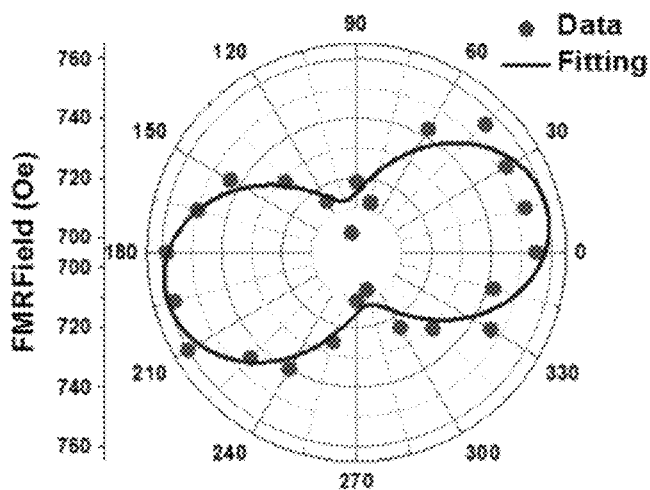
Figure 2D:
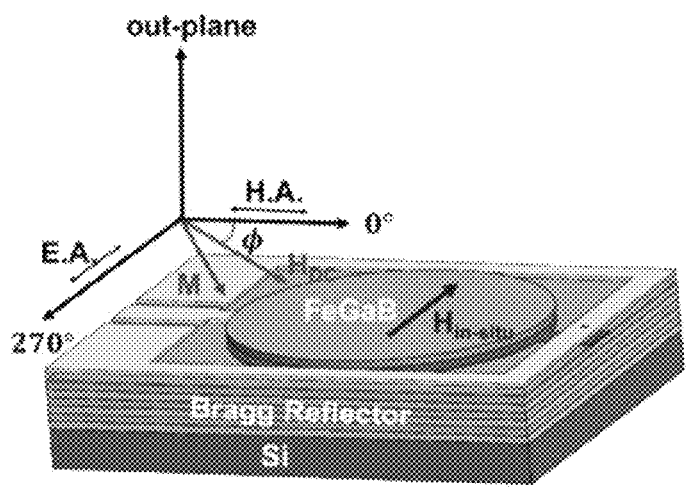
Figure 2E:
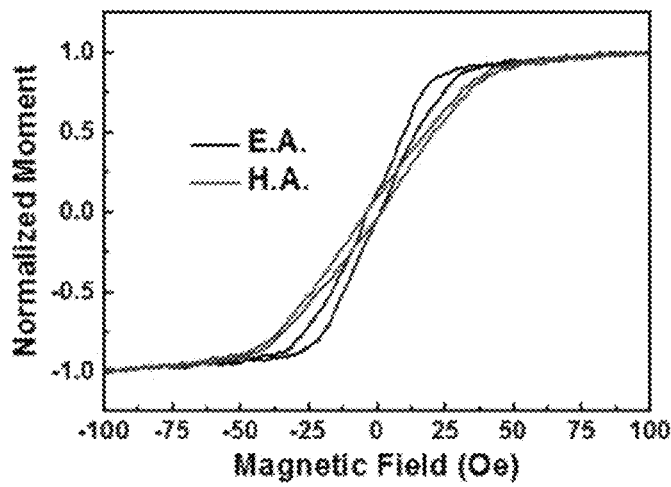

The magnetic properties of FeGaB/SiO$_2$ multilayers have been characterized using different tools such as vibration sample magnetometer (VSM), ferromagnetic resonance (FMR) spectroscopy, and a magneto optic Kerr effect (MOKE) system. The results of both (i) patterned devices with magnetic stack on ZnO film and (ii) a reference sample with 5 mm×5 mm FeGaB full film directly on Si substrate, are displayed in FIGS. 2A-2H. FIGS. 2A-2C relate to the reference sample, and FIGS. 2D-2H relate to the patterned devices with a magnetic stack. Note that the variation in magnetic properties between the reference film and patterned device are due to the different shape anisotropy, stress, surface state of substrates, among others. All magnetic films were sputtered onto substrates under an in-situ magnetic field of ~300 Oe, which induces an in-plane uniaxial magnetic anisotropy (UMA). FIGS. 2A and 2D illustrate the coordinate systems for in-plane measurements of the reference films and patterned devices, respectively. The 0 degree is aligned perpendicular to the in-situ magnetic field, which represents the hard axis (H.A.) of reference films and corresponds to the anchor direction of ME antennas. To evaluate how the in-situ applied magnetic field during deposition affects the magnetic anisotropy of FeGaB/SiO$_2$ multilayers, the room temperature magnetic hysteresis loops are measured and shown in FIGS. 2B and 2E. A clear in-plane magnetization easy axis (E.A.) is seen in the reference film (FIG. 2B) that indicates a well-defined uniaxial magnetic anisotropy. A small coercive field of 1.4 Oe with an effective in-plane anisotropy field of ~25 Oe, which is characterized as soft magnetic property, are significant for achieving large piezomagnetic coefficients and self-biasing properties for the device. While the magnetic multilayers are directly deposited on ZnO films and patterned for ME antennas, the E.A. and H.A. magnetic saturation field is 38 Oe and 50 Oe, respectively (FIG. 2E), representing a weak uniaxial in-plane anisotropy. Apart from the description of magnetic anisotropy from hysteresis loops, a detailed understanding of the uniaxial anisotropy was obtained by measuring the in-plane angular dependence of FMR fields.

Figure 2F:
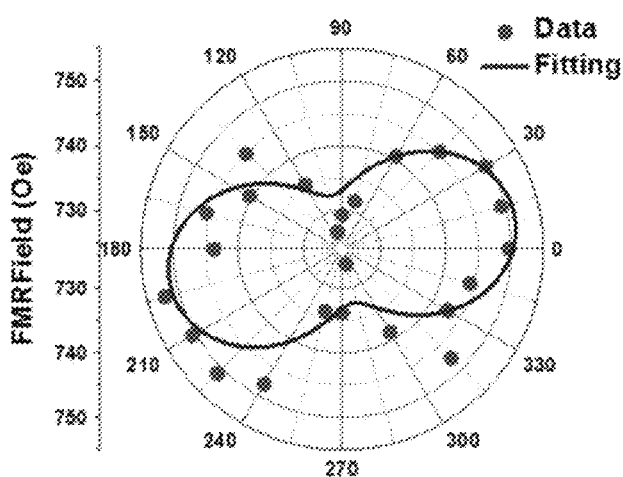
Figure 2G:
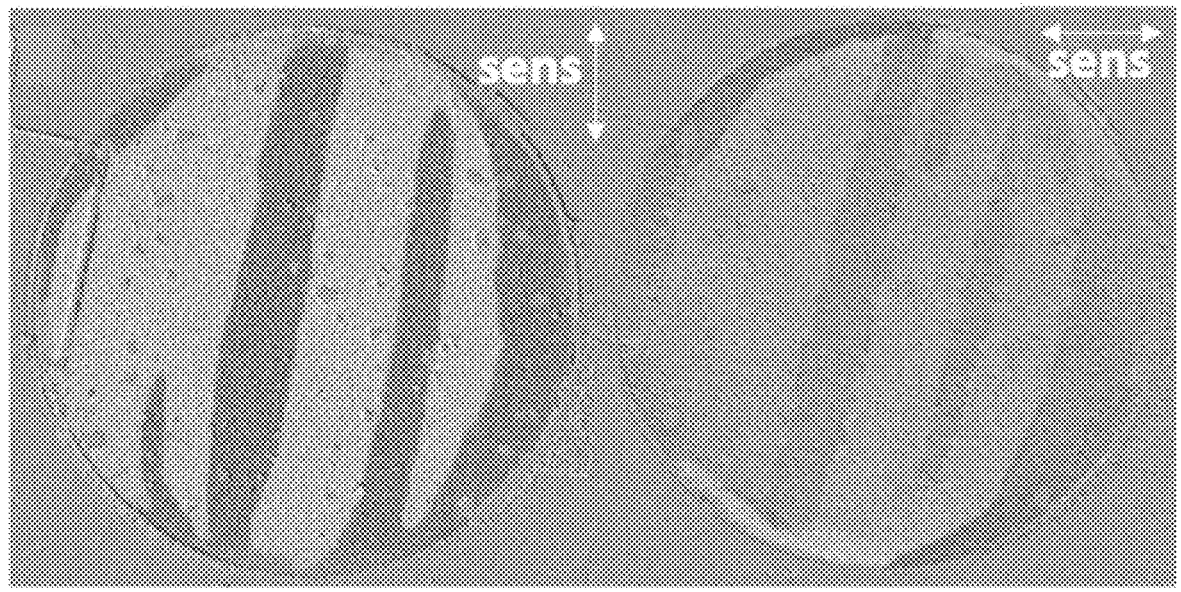
Figure 2H:
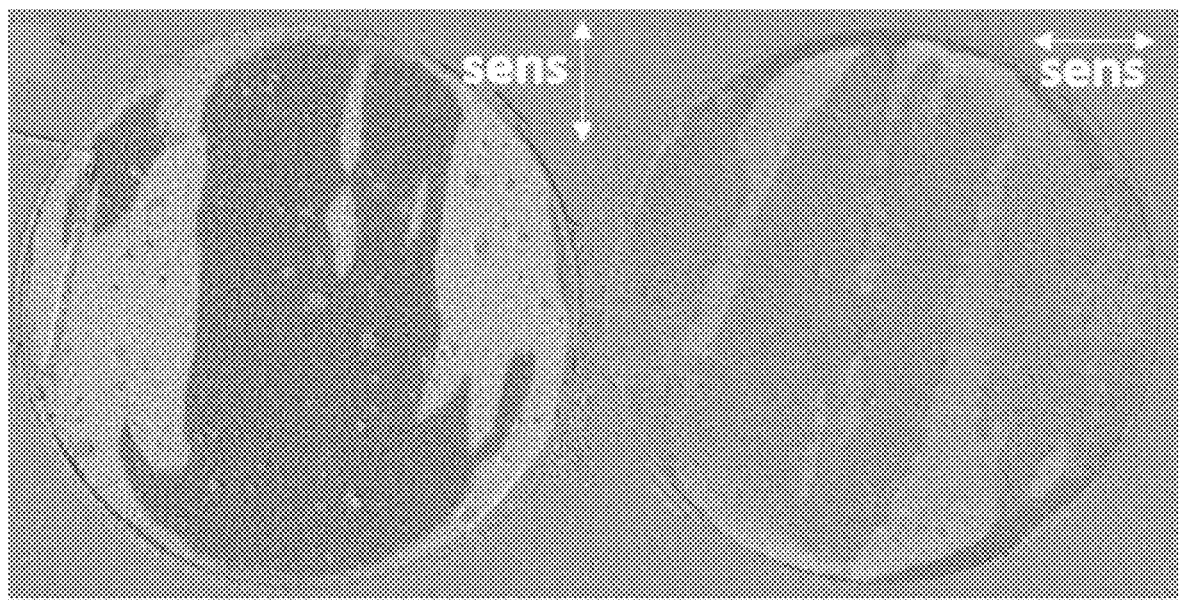

The source of UMA can be attributed to magnetocrystalline anisotropy, interfacial charge transfer, substrate surface topography, magnetic field induced anisotropy and the stress effect. Due to the amorphous structure of the thick seed layer and smooth substrate surface, the in-situ magnetic field and induced stress cause the UMA. A detailed investigation on the anisotropic stress of FeGaB films suggests the stress-induced UMA. The results of in-plane angular dependence of FMR fields clearly shows a twofold UMA in both reference films and ME antennas. However, there is a misalignment between the direction of maximum FMR field and 0 degree in both samples, as shown in FIGS. 2C and 2F. This misalignment is further verified by the MOKE results of a patterned device. As displayed in FIGS. 2G and 2H, both the demagnetization and remnant magnetization states of the FeGaB/SiO$_2$ stack show a tilted angle relative to the direction of in-situ magnetic field during the deposition. These results agree well with the symmetries of the measured antenna gain and polarization patterns shown in FIGS. 5A-5H. The FMR fields in the UMA can be fitted as: $H_r = A*\sin^2(\varphi - B) + C$, where $\varphi$ and constant B are the angle between 0 degrees and applied DC magnetic field and shifted H.A., separately; A and C are the fitted coefficients that represent anisotropic properties of the UMA. The reference film has a shifted H.A. angle value (B) of 12.77. The ME antenna has a shifted H.A. angle value (B) of 11.31 degrees. This is due to either the small in-plane rotation caused by sample alignment inside the in-situ magnetic field, the induced stress during the film deposition process, or both. The competition between the in-situ magnetic field and stress induced UMA could result in the shift of H.A. The magnitude of constant A indicates the strength of UMA, where an isotropic sample has a value of 0 and a sample with higher UMA shows a larger value of A. The magnitude of A for the reference film and ME antenna is 47.24 and 18.59, respectively; thus, the UMA of the reference film is larger than that of the ME antenna. These results are consistent with VSM measurements (FIGS. 2B and 2E) and can be attributed to the surface roughness of substrates. The effects of surface roughness on magnetic properties of different magnetic films on plasma-etched substrates have been investigated through various techniques. As the surface roughness increases gradually, the UMA decreases and finally disappears. A possible reason is that the stress between magnetic films and substrates is relieved when the surface becomes rougher. On the other hand, the magnetization reversal changes from domain rotation to domain wall motion as the surface roughness increases, which is confirmed from MOKE results.

Figure 3A:
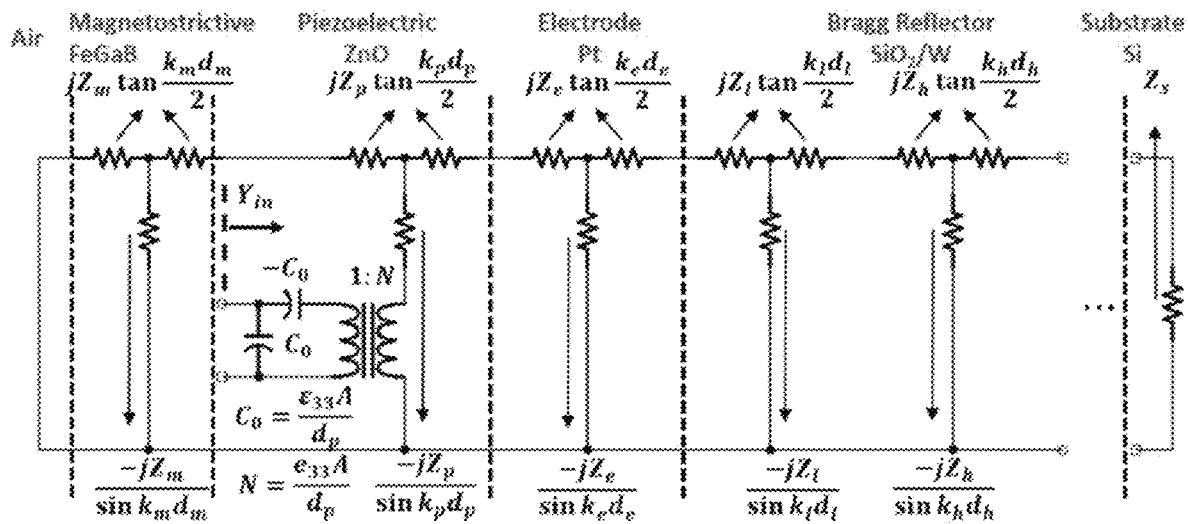
FIG. 3A shows an equivalent circuit model of the SMR-based ME antenna according to the invention.
Figure 3B:
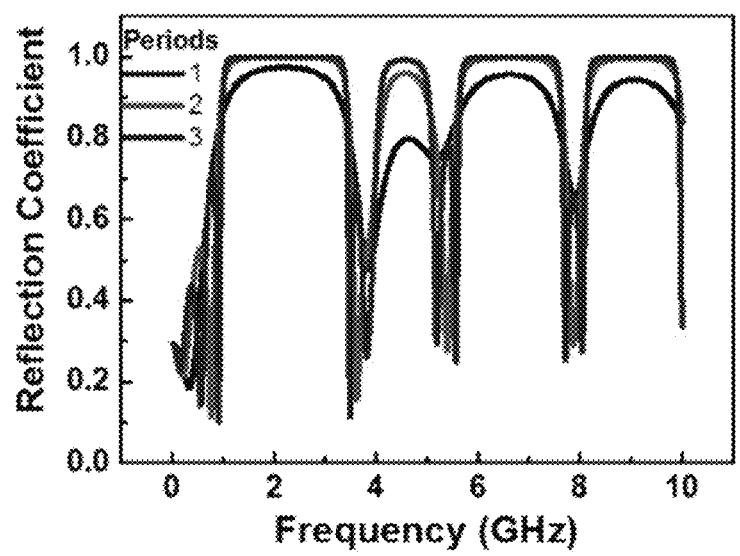
FIG. 3B shows the reflection coefficient of the Bragg reflector depicted in FIG. 3A.

Various simulation methods were implemented to design and optimize the performance of an SMR-based ME antenna with a focus on the Bragg reflector and ME composites. A 1D Mason's model was employed to estimate the reflection coefficient frequency response of a carefully arranged Bragg reflector. FIG. 3A shows an equivalent circuit model of the SMR-based ME antenna analyzed by the Mason's model and based on transmission line theory. The load acoustic impedance decreases as the total number n of Bragg reflector layers (n) increases, therefore, a large value of n is desired for the resonator structure. Typically, three pairs of low/high acoustic impedance layers (n=6) are chosen for SMRs. In order to correlate the working frequency bandwidth of the Bragg reflector with the resonant frequency of the piezoelectric resonator, the thickness of each layer is determined by the equation:

$$d_{acoustic} = v_{acoustic}/4f.$$

where $d_{acoustic}$ and $v_{acoustic}$ are the thickness and acoustic velocity, respectively, of the Bragg reflector layers. In this work, the working frequency of SMR-based ME antenna was not specified, therefore, the thickness of each layer was not exactly a quarter wavelength of the acoustic wave. From the simulated equivalent circuit model of the SMR-based ME antenna, the reflection coefficient of the designed Bragg reflector, consisting of three pairs of silicon dioxide (SiO$_2$) and tungsten (W) layers, was calculated. The reflection coefficient is plotted in FIG. 3B. The total reflection seen from the resonant structure is formed over a wide frequency range from 1 to 3 GHz. The influence on the reflection coefficient with varying number of periods is also exploited and displayed in FIG. 3B. As more periods are applied, more energy is reflected from Bragg substrate and so the frequency band widens. It has been shown that there is minimal improvement in the reflection coefficient when the number of periods exceeds three.

Figure 3C:
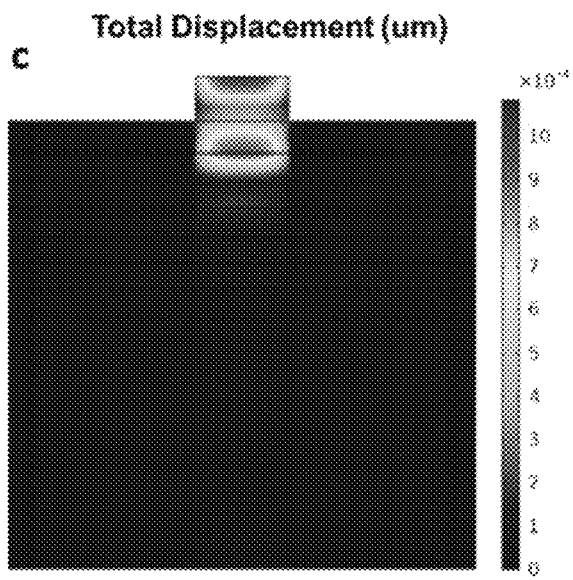
FIG. 3C-3E shows the displacement profile and the standing wave amplitude as a function of depth of the ME antenna depicted in FIG. 3A.
Figure 3D:
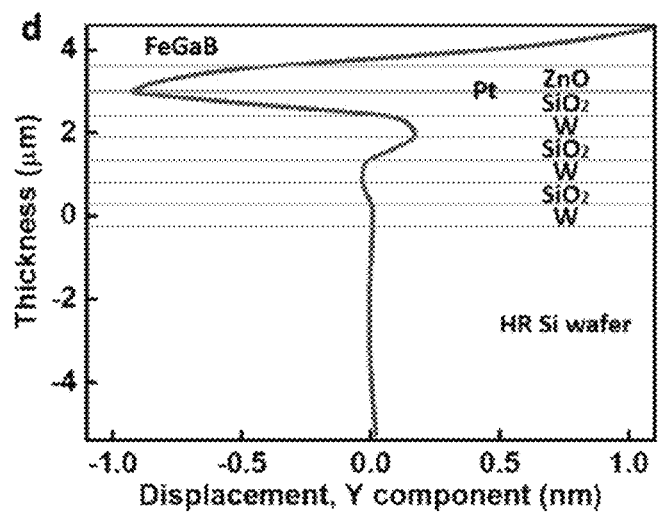
Figure 3E:
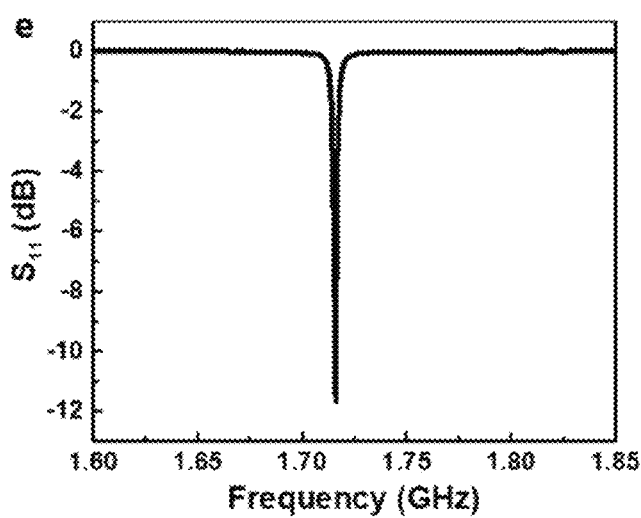

To achieve a frequency domain analysis of the admittance spectrum, a 2D model of the ME antenna was developed, and the coupling between electrical potential and mechanical displacement in the antenna was simulated using a finite element method (FEM) simulation tool. The displacement profile and the standing wave amplitude as a function of depth of the designed ME antenna at the electromechanical resonant frequency of 1.7 GHz are presented in FIGS. 3C-3E. The 2D strain assumption is used in this model. As shown in FIG. 3C, the magnitude of the total displacement profile of the longitudinal waves, which illustrates the proposed 2D model of the device, is simulated at the electromechanical resonant frequency. The developed Bragg reflector is shown with optimized performance as the acoustic wave energy is well confined within the ME composites, with little energy dissipating into the substrate. By plotting the y component of the displacement, the standing wave amplitude as a function of depth is illustrated in FIG. 3D. The return loss curve of the ME antenna is plotted in FIG. 3E, which is achieved by the frequency domain analysis with the 2D FEM model. The thicknesses of each individual layer in the Bragg reflector determines the working frequency of SMR antenna. The values of thicknesses used in the 2D FEM simulation were specified according to the measured values from the SEM image, as shown in FIG. 1A. However, as explained previously, the performance of SMRs can be improved by adjusting the thickness of the Bragg reflector layer to be a quarter wavelength of the acoustic wave.

Figure 4A:
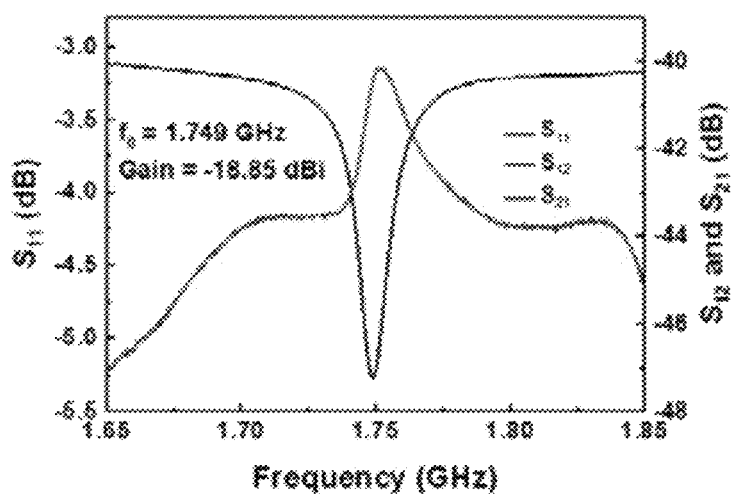
FIG. 4A shows the return loss ($S_{11}$), receiving ($S_{12}$) and transmitting ($S_{21}$) behaviors of the SMR-based ME antenna according to the invention.
Figure 4B:
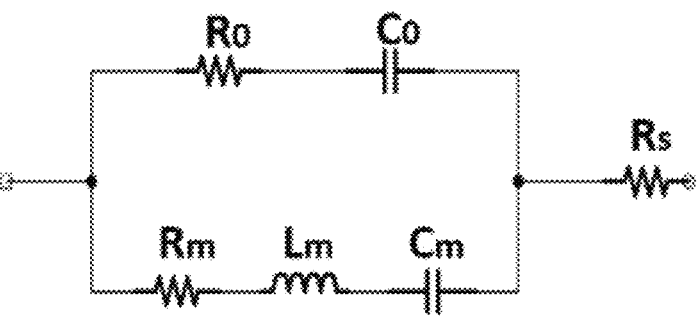
FIG. 4B shows schematics and associated fitting parameters for modified Butterworth Van Dyke (MBVD) model of the SMR-based ME antenna according to the invention.
Figure 4C:
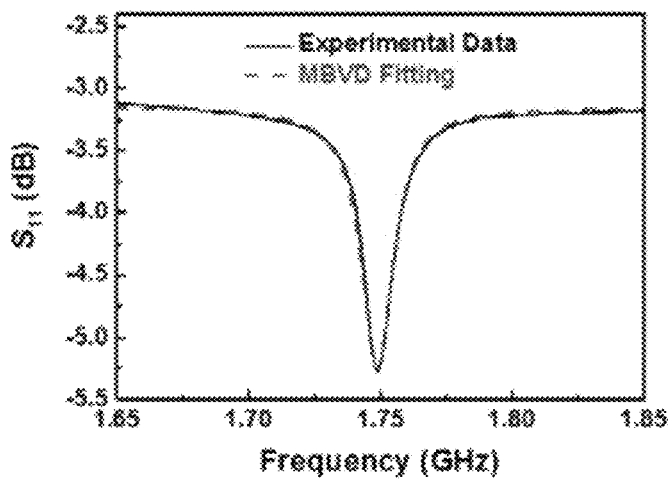
FIG. 4C shows the MBVD fitting curve for return loss $S_{11}$ of the SMR-based ME antenna according to the invention.

The antenna gain was characterized in an anechoic chamber by utilizing a calibrated linear polarization standard horn antenna. As shown in FIG. 4A, the return loss curve ($S_{11}$), receiving ($S_{12}$) and transmitting behavior ($S_{21}$) of the SMR antenna with a resonant frequency of 1.749 GHz and antenna gain of −18.85 dBi are presented. Clearly, $S_{12}$ and $S_{21}$ curves overlap with each other. The electromechanical resonance frequency $f_0$, which is defined by the thickness of the ME disk, is expressed as:

$$f_0 \propto \frac{1}{2T}\sqrt{\frac{E}{\rho}}, \quad (1)$$

where T is the thickness of the ME disk, E and ρ are the equivalent Young's modulus and equivalent density of the resonator, respectively. FIG. 4B presents schematics and associated fitting parameters for modified Butterworth Van Dyke (MBVD) model with electrical and equivalent mechanical components of SMR antenna of the example embodiments. The electromechanical coupling coefficient ($k_t^2$) and quality factor (Q) are calculated as 1.0% and 95, respectively. The MBVD fitting curve for return loss Sit is plotted in FIG. 4C and matches the measurements well. Compared to the released FBAR ME antenna published by Nan et al. (Nan T, Lin H, Gao Y, Matyushov A, Yu G, Chen H, et al., *Acoustically actuated ultra-compact NEMS magnetoelectric antennas*, Nature Communications 2017, 8(1): 296), the example embodiments of the SMR-based magnetoelectric (ME) antenna described herein has a 10 dBi higher gain. Although the calculated gain for FBAR antenna is −18 dBi, the influence of the metallic holder underneath the FBAR antenna chip was not considered. Therefore, the actual gain for the free-standing membrane FBAR antenna should be about −28 dBi when the metallic reflecting components are removed from the test setup.

After replacing the metallic sample holder with 3D-printed plastic materials in the probe station system, we characterized the SMR antennas. The gain enhancement of the SMR antenna is attributed to the Bragg reflector helping to confine more acoustic energy in the ME films allowing for greater amplitude in EM waves.

A high linearity is generally desired for components in RF systems such as filters, amplifiers and antennas. This is desired because there are numerous different bands and they have to be protected from any undesired signals. Furthermore, nonlinearity of the devices can degrade the performance of the system quite heavily. It has been reported that the acoustic resonators exhibit a nonlinear behavior at high power levels. Since the power density and temperature play significant roles with respect to nonlinearity, various methods such as the device structure, area, materials, etc., may be used to improve the linearity of acoustic resonators.

Figure 4D:
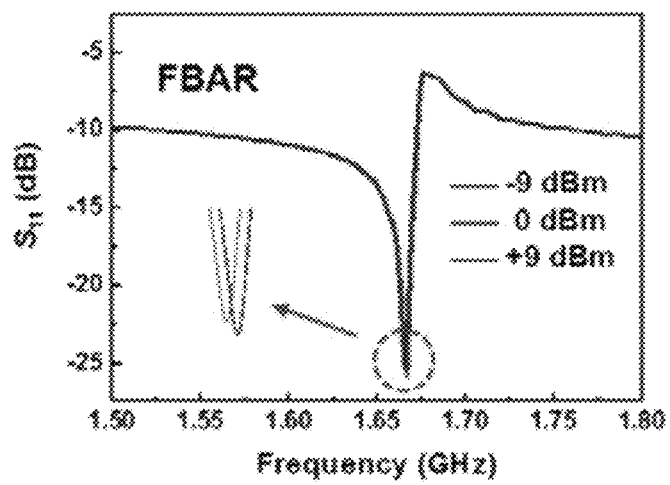
FIG. 4D shows return loss $S_{11}$ of the FBAR antenna configuration.
Figure 4E:
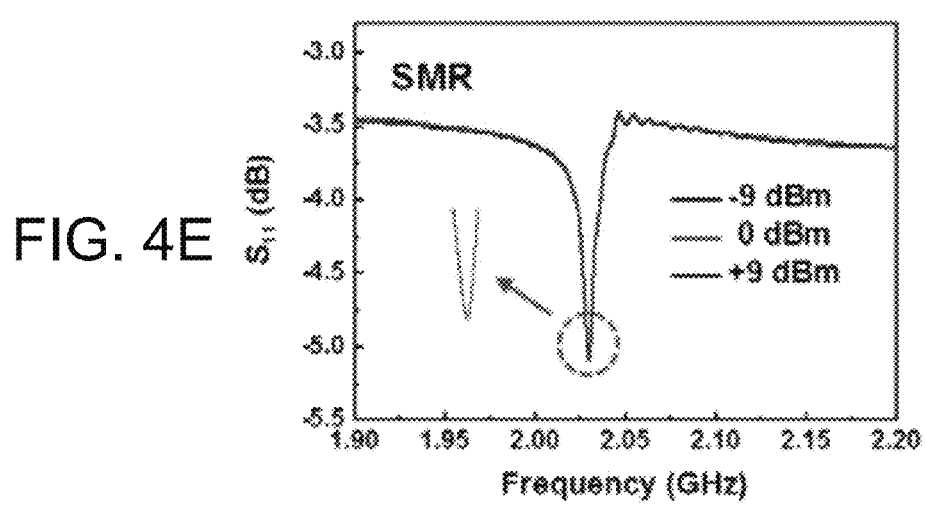
FIG. 4E shows return loss $S_{11}$ of the SMR-based ME antenna according to the invention.
Figure 4F:
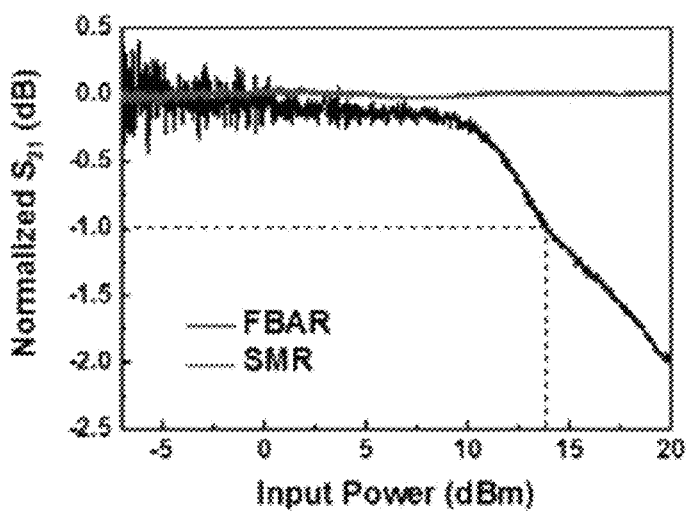
FIG. 4F shows power handling capability of the FBAR antenna and SMR-based ME antenna, characterized by power sweep results.

The power handling capability of the FBAR and SMR antennas are characterized by the power sweep results shown in FIG. 4F. The 1 dB compression point (P1 dB) is determined by measuring the $S_{21}$ curves as a function of input power. The FBAR antenna has a P1 dB of 13.8 dBm, while the P1 dB of the described SMR antenna is larger than 20 dBm, demonstrating a better power handling capability of the SMR antenna as compared to the FBAR antenna. The $S_{11}$ curves of the FBAR and SMR antennas at different input power levels are shown in FIGS. 4D and 4E. The resonance peak of the FBAR antenna shifts to a lower frequency at high input power, which indicates that the FBAR antenna starts going into nonlinear region. The resonance peak of the SMR antenna remains substantially unchanged as the input power increases. This can be explained by the self-heating effects at high power levels. As the input power increases, the high power-density may lead self-heating of the resonator and consequently higher temperature, which in turn may result in the observed nonlinear effects. Compared to the free-standing FBAR membrane structure, the SMR antenna of the described embodiments (with acoustic Bragg reflector stacks) has a larger thermal conductivity, which results in a better power handling capability. Finally, the comparison of performance metrics between the FBAR and SMR antennas are listed in Table 1.

TABLE 1

Performance comparison between the FBAR and SMR ME antennas.

| ME Antenna | $S_{11}$ (dB) | Gain (dBi) | P1dB (dBm) | Stress Control | Robustness |
|---|---|---|---|---|---|
| FBAR | <−20 | −28.0 | 13.8 | Hard | Bad |
| SMR | ~−5 | −18.9 | >20 | Easy | Good |

Figure 5A:
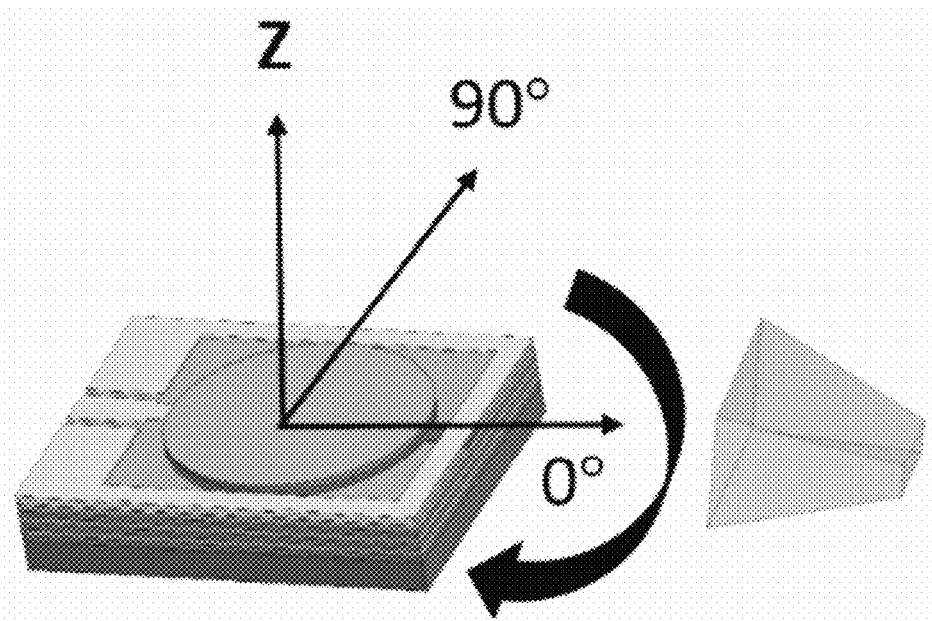
FIG. 5A-5D illustrates schematic representations of the SMR-based ME antenna according to the invention being radiated by a standard horn antenna rotated along three major axes of the SMR-based ME antenna.

The radiation characteristics of the SMR-based ME antennas were tested in a far-field configuration with a distance of 0.76 m between SMR antenna and horn antenna. The active radiative element of the SMR antenna is defined by the ZnO/FeGaB ME heterostructure disk with a diameter of 200 μm. Due to the small size of the SMR antenna and the limitations of the probe station, only measurements of the in-plane radiation pattern 180 degrees around the SMR device were acquired. The schematics and measured radiation pattern are shown in FIG. 5A. A dipole-like radiation pattern is manifested due to the symmetry of the SMR antenna. The radiation pattern shows an approximate shift of 7 degrees from the center of the horn antenna, due to the in-plane tilt of the magnetic easy axis, as shown in FIG. 2.

Figure 5B:
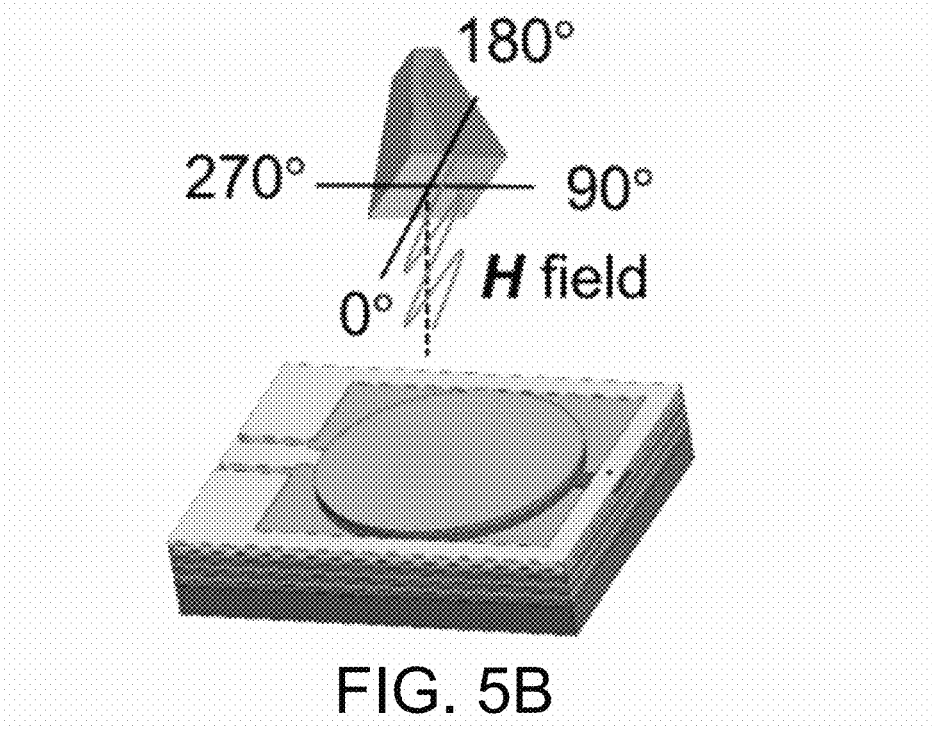
Figure 5C:
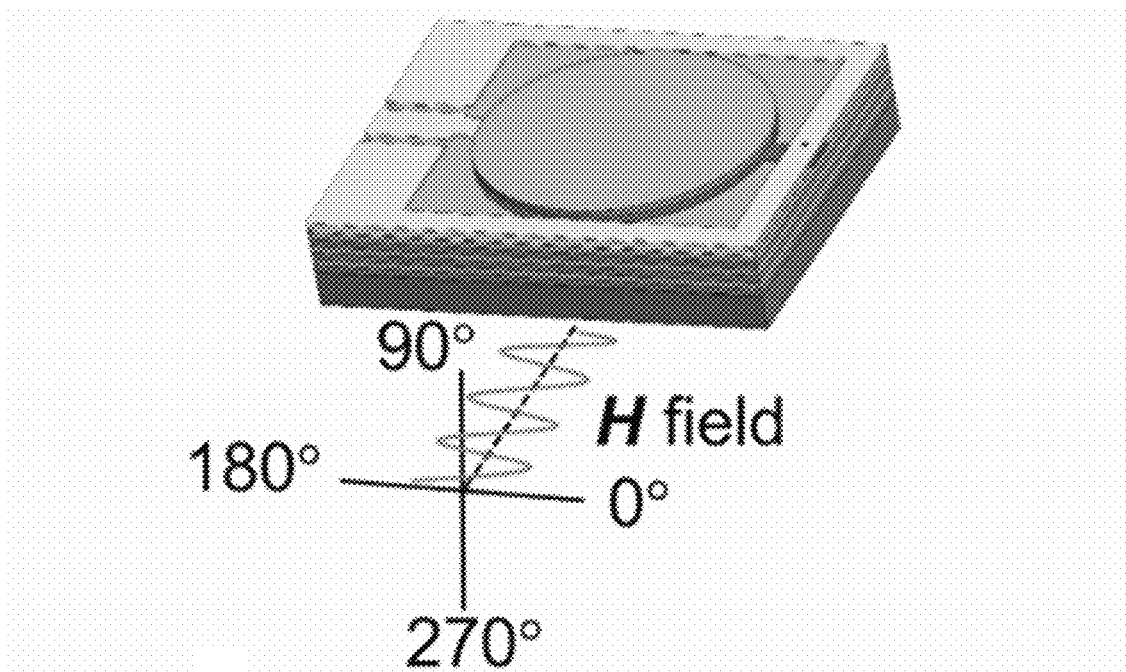
Figure 5D:
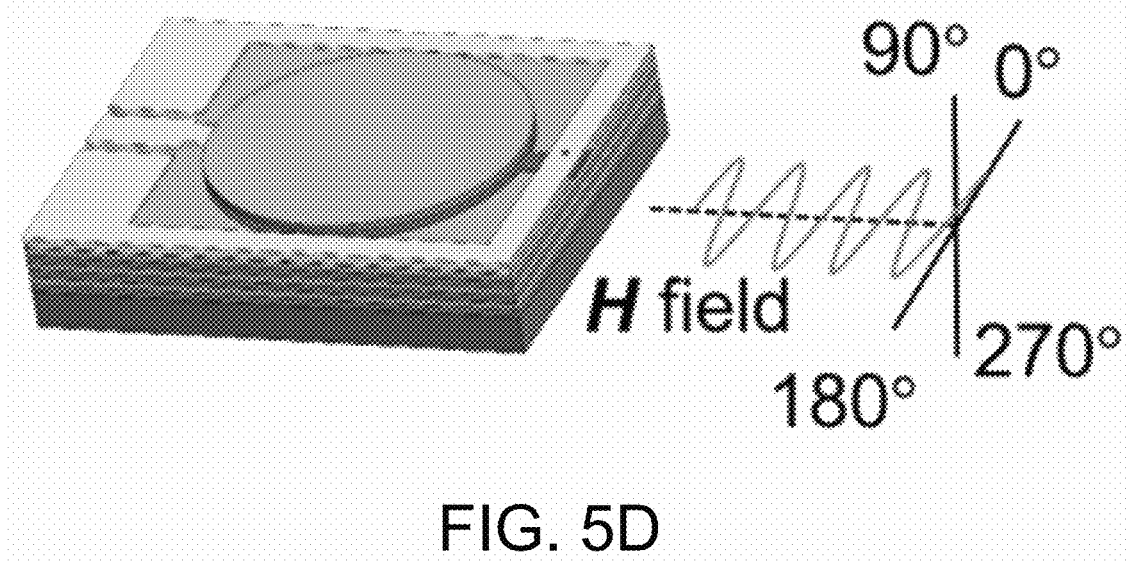
Figure 5E:
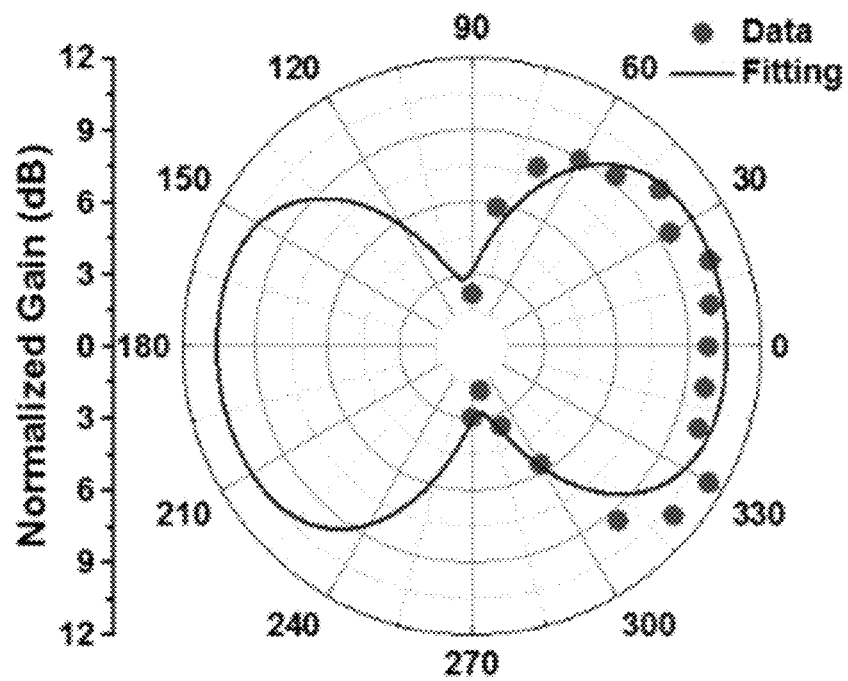
FIGS. 5E-5H show the normalized gain plots corresponding to the configurations of FIGS. 5A-5D, respectively.
Figure 5F:
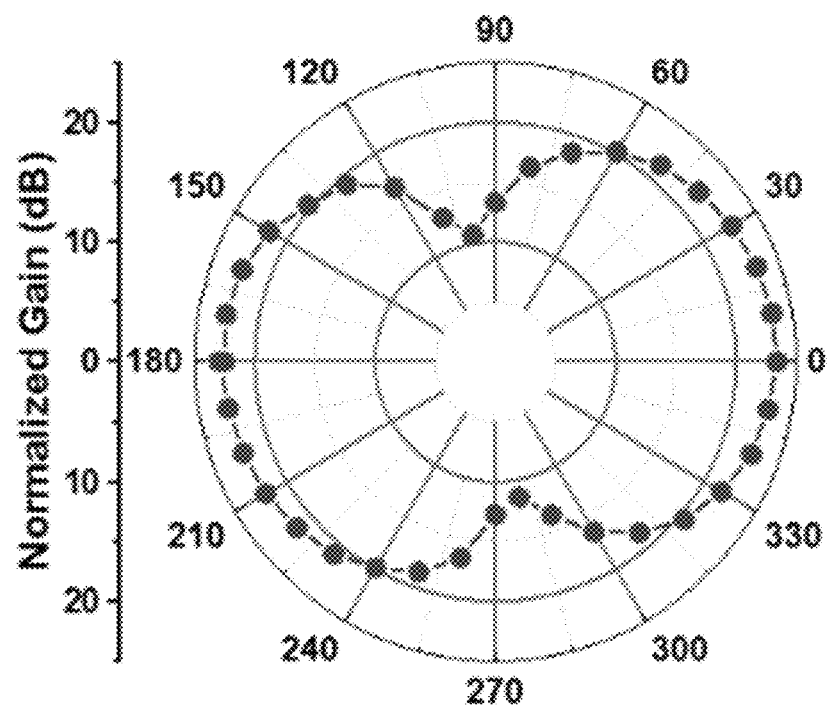

The maximum gain is located along the tilted direction of the anchor length (the 7 degree point as shown in FIG. 5E), which is the H.A. of the magnetostrictive FeGaB film. At 7 degrees, the RF magnetic field component of EM wave is parallel to the magnetization of the magnetostrictive layer, which results in maximum coupling efficiency between the SMR antenna and EM wave to achieve maximum gain. When in-plane radiation is measured at 97 degrees from the center, the antenna gain approaches its null value because the RF magnetic field is perpendicular to the magnetization.

Figure 5G:
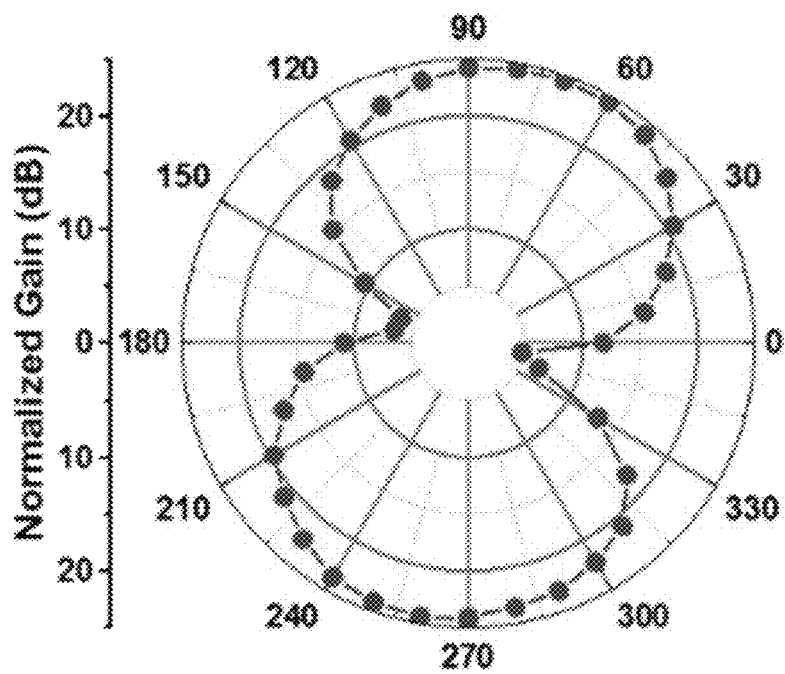
Figure 5H:
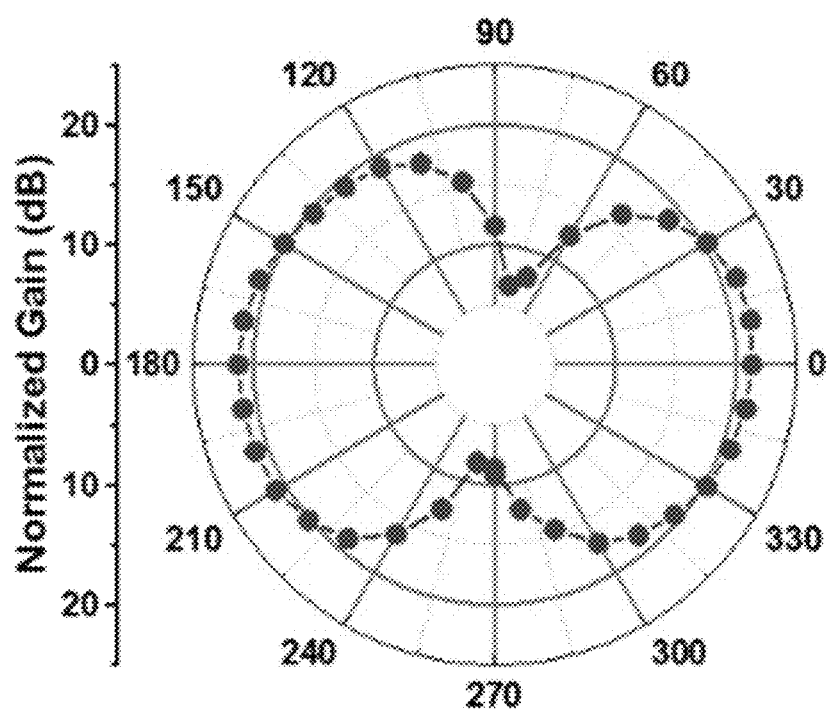

The polarization behaviors of SMR ME antennas were also measured by rotating the standard horn antenna along three major axes, as shown in FIGS. 5B-5D. In the schematic representations of FIGS. 5A-5D, the horn antenna was rotated along the out-of-plane axis (FIG. 5B), in-plane axis perpendicular the anchor direction (FIG. 5C) and in-plane axis along the anchor direction (FIG. 5D). The sinusoidal wave along 0° and 180° in all the schematics indicates the RF H-field component of the EM waves from the horn antenna. The normalized gain plots in FIGS. 5F-5H, corresponding to FIGS. 5A-5D, respectively show a similar shape of bifold symmetry, which results from the in-plane uniaxial magnetic anisotropy of the FeGaB/ZnO multilayer in the resonating disk of the SMR antenna. As presented in FIG. 5F, the highest gain of the SMR antenna is achieved at 0 degrees when the $H_{rf}$ is perpendicular to the anchor length direction and the lowest gain is measured at 90 degrees when the $H_{rf}$ is parallel to the anchor length direction. The other two polarization charts in FIGS. 5G and 5H show a similar behavior where the maximum gain is obtained along the easy axis direction of magnetic anisotropy. This is because the strongest coupling between $H_{rf}$ and the SMR ME antenna is achieved when $H_{rf}$ is parallel to the easy axis, which is in the direction of the highest permeability, due to the magnetic anisotropy, in the ME disk. The polarization patterns in FIGS. 5G and 5H also verify the in-plane radiation pattern as shown in FIG. 5E, where the maximum gain is observed along the anchor length direction. The measured results in FIG. 5E demonstrate that the strong coupling between the H-field component of EM waves and the magnetostrictive phase of FeGaB/ZnO heterostructures in SMR antenna will ultimately improve ME antenna gain.

The acoustic impedance of various materials is the key point for creating effective Bragg reflectors used for ME antennas. Silicon (Si), silicon dioxide (SiO2) and aluminum (Al) are common low impedance materials for Bragg reflectors while platinum (Pt), tungsten (W) and iridium (Ir) are introduced as high impedance materials. The example embodiment employs sputtered silicon dioxide ($SiO_2$) and tungsten (W) as the low and high, respectively, acoustic impedance materials to construct the Bragg reflector, which provides a good acoustic impedance ratio along with a cost-effective fabrication process.

To achieve strong ME coupling in the magnetostrictive/piezoelectric ME composites, ferromagnetic/ferroelectric materials with large piezomagnetic/piezoelectric coefficients are desired. Excellent magnetic softness and magnetostrictive behaviors have been realized in FeGa-based thin films, which have already been applied in different RF/microwave tunable devices. Aluminum nitride (AlN) and zinc oxide (ZnO) are two of the most popular piezoelectric materials for FBAR devices, among which, AlN has been chosen as the material for commercial BAW filters that operates at 1-2 GHz because of its quality factor (Q). However, ZnO has larger $K_t^2$ and wider bandwidth than AlN due to its higher piezoelectric coefficient. Moreover, the deposition, control of texture, and stoichiometry of ZnO is much easier compared with that for AlN. ZnO films with highly c-axis-preferred orientation are essential for realizing high-quality SMR-type ME antennas. To fabricate SMR-based ME antennas, $SiO_2$/W as the low/high impedance Bragg reflector, and FeGaB/ZnO as the magnetostrictive/piezoelectric ME composite were carefully designed and deposited by RF magnetron sputtering. Platinum (Pt) and gold (Au) were chosen as the bottom and top electrodes, respectively, due to the benefits for growing highly c-axis-textured ZnO thin films and good conductivity, although it should be understood that other electrically conductive materials may alternatively be used to form the electrodes.

In the example embodiment, the thin-film materials were prepared in a magnetron sputtering system at the Argon (Ar) flux density of 15 SCCM with a base pressure of $\sim 1 \times 10^{-7}$ Torr. The oxides including $SiO_2$ and ZnO were deposited by reactive RF sputtering, and other metallic thin films involving W, FeGaB, Pt, and Au were DC sputtered. All materials were deposited at room temperature except ZnO layer, which was deposited at 450° C. to achieve a highly c-axis-orientated structure. For the Bragg reflector with structure of [W (531 nm)/SiO2 (543 nm)]$_3$, W layers were sputtered at a plasma power of 50 W and an Ar atmosphere of 4.5 mTorr; $SiO_2$ layers were deposited by reactive RF sputtering from a Si target with a 10:1 Ar/$O_2$ gas mixture at a plasma power of 75 W and a sputtering pressure of 6 mTorr. For the piezoelectric/magnetostrictive ME composite, the piezoelectric ZnO layer was prepared by reactive RF sputtering from a Zn target with a 3:1 Ar/$O_2$ gas mixture at a plasma power of 150 W and a sputtering pressure of 3 mTorr; the magnetostrictive multilayer with the structure of [FeGaB (85 nm)/SiO$_2$ (5 nm)]$_{10}$ was deposited on a 10 nm Cr seed layer at a plasma power of 50 W and a sputtering pressure of 3 mTorr. The FeGaB and $SiO_2$ layers were sputtered from a $(Fe_{80}Ga_{20})_{88}B_{12}$ (DC sputtering) target and a $SiO_2$ (RF sputtering) target, respectively. Ti (5 nm)/Pt (50 nm) and Cr (5 nm)/Au (100 nm) electrodes were prepared at 30 W and 3 mTorr. X-ray reflectivity method was used to calibrate the deposition rates.

The example embodiment employs a high resistivity (>10000 Ω·cm) Si wafer as the substrate 102. The Bragg reflector 104, which consists of three pairs of W/SiO$_2$ layers, is sputter-deposited in one run, with RF reactive magnetron sputtering for SiO$_2$ and DC sputtering for W, in a plasma vapor deposition (PVD) system. A 50-nm-thick Pt film is sputter-deposited and patterned by lift-off on top of the Bragg reflector to establish the bottom electrodes. Then, the ZnO film is sputter-deposited by RF reactive sputtering with Zn target and high-purity O$_2$ gas, and vias were etched by hydrochloric (HCl) acid to access the bottom electrodes. After that, a 100-nm-thick Au film is sputtered and patterned by lift-off to form the top ground electrode. It should be understood that other thicknesses of the top and bottom electrodes may alternatively be used. Finally, the FeGaB/SiO$_2$ multilayer layer is deposited by a magnetron sputtering and patterned by lift-off. A 300 Oe in-situ magnetic field bias that is perpendicular to the anchor direction of the device was applied during the magnetic deposition to pre-orient the magnetic domains, although other amounts of magnetic field bias may alternatively be applied.

The SMR structures for ME antennas described herein not only improve upon the antenna performance metrics of know FBAR structure antennas, but also simplifies the process with better device structural integrity and eliminates the extra packaging steps required for device protection. The example embodiment of a micro-sized ME antenna that takes advantage of a solidly mounted resonator to confine energy in the magnetostrictive/piezoelectric heterostructure to demonstrate improvements in antenna radiation as compared to existing FBAR antenna structures. The example SMR ME antenna, with an overall dimension of 700 um×700 um (L×W), was designed and optimized to operate at a resonant frequency of 1.749 GHz and demonstrated a gain of −18.85 dBi. Other embodiments may improve performance by increasing the SMR quality factor and optimizing the impedance matching with the signal feedline to the resonator.

The example SMR ME antenna described herein provides more robust features than its FBAR freestanding membrane counterpart. Due to its small size, high operating frequency, high sensitivity, structural stability, semiconductor processing integration, and good power handling capability, it has applicability for small-size microwave antennas and remote wireless sensing applications used for compact UAVs, bio-implantable antennas, wearable antennas, IoT, NFC, RFID, satellites, etc.

While example embodiments have been particularly shown and described, it will be understood by those skilled in the art that various changes in form and details may be made therein without departing from the scope of the embodiments encompassed by the appended claims.

What is claimed is:

1. A solidly mounted resonator (SMR)-based magneto-electric (ME) antenna, comprising:
    a substrate;
    a Bragg reflector disposed on the substrate;
    a magnetostrictive/piezoelectric ME composite element disposed on the Bragg reflector;
    a first electrically conductive contact disposed between the Bragg reflector and the magnetostrictive/piezoelectric ME composite element and electrically coupled to a bottom surface of the magnetostrictive/piezoelectric ME composite element; and
    a second electrically conductive contact disposed on top of the magnetostrictive/piezoelectric ME composite element and electrically coupled to a top surface of the magnetostrictive/piezoelectric ME composite element.

2. The SMR-based ME antenna of claim 1, wherein the Bragg reflector comprises alternating layers of high acoustic impedance materials and low acoustic impedance materials.

3. The SMR-based ME antenna of claim 2, wherein the high acoustic impedance layers are tungsten (W), and the low acoustic impedance layers are silicon dioxide ($SiO_2$).

4. The SMR-based ME antenna of claim 2, wherein the alternating layers further comprise three layers of high acoustic impedance materials and three layers of low acoustic impedance materials.

5. The SMR-based ME antenna of claim 1, wherein the first electrically conductive contact and the second electrically conductive contact are constructed and arranged to provide an electrical impedance match to a transmission line that couples the SMR-based ME antenna to a receiver or to a transmitter.

6. The SMR-based ME antenna of claim 1, wherein the first electrically conductive contact is platinum (Pt) and the second electrically conductive contact is gold (Au).

7. The SMR-based ME antenna of claim 1, wherein the magnetostrictive/piezoelectric ME composite element comprises a magnetorestrictive multilayer deposited on a piezoelectric layer.

8. The SMR-based ME antenna of claim 7, wherein the magnetorestrictive multilayer comprises FeGaB and $SiO_2$, and the piezoelectric layer comprises ZnO.

9. The SMR-based ME antenna of claim 7, wherein the magnetorestrictive multilayer produces an in-plane uniaxial magnetic anisotropy (UMA).

10. The SMR-based ME antenna of claim 9, wherein the UMA is a twofold UMA that exhibits a symmetric radiation pattern.

11. The SMR-based ME antenna of claim 1, wherein the magnetostrictive/piezoelectric ME composite element is patterned to exhibit a specific radiation pattern.

12. A method of fabricating a solidly mounted resonator (SMR)-based magnetoelectric (ME) antenna, comprising:
    providing a silicon substrate;
    depositing a Bragg reflector on the silicon substrate;
    depositing at least one bottom electrode on the Bragg reflector;
    depositing a ZnO film on the bottom electrode and the Bragg reflector;
    depositing a top electrode on the ZnO film; and
    depositing a FeGaB/$SiO_2$ multilayer on the top electrode and the ZnO film.

13. The method of claim 12, wherein depositing a Bragg reflector on the silicon substrate further comprises sputtering alternating layers of tungsten (W) and silicon dioxide ($SiO_2$) on the substrate, and wherein the sputtering of the W layers is performed with DC sputtering and the sputtering of the $SiO_2$ layers is performed with RF reactive magnetron sputtering.

14. The method of claim 13, wherein sputtering alternating layers of W and ($SiO_2$) further comprises sputtering three layers of W and three layers of $SiO_2$.

15. The method of claim 12, further comprising applying an in-situ magnetic field bias, perpendicular to the anchor direction of the device, while depositing the FeGaB/$SiO_2$ multilayer on the top electrode and the ZnO film.

16. The method of claim 12, further comprising providing a silicon substrate that has a resistivity of at least 10,000 Ω·cm.

17. A transceiver system comprising:
    solidly mounted resonator (SMR)-based magnetoelectric (ME) antenna, comprising:
        a substrate;
        a Bragg reflector disposed on the substrate;
        a magnetostrictive/piezoelectric ME composite element disposed on the Bragg reflector;
        a first electrically conductive contact disposed between the Bragg reflector and the magnetostrictive/piezoelectric ME composite element, electrically coupled to a bottom surface of the magnetostrictive/piezoelectric ME composite element; and
        a second electrically conductive contact disposed on top of the magnetostrictive/piezoelectric ME composite element and electrically coupled to the top of the magnetostrictive/piezoelectric ME composite element;
    an impedance matcher coupled to the first electrically conductive contact and the second electrically conductive contact;
    a transceiver having one or both of a receiver component and a transmitter component; and
    a transmission line having (i) a first end electrically coupled to the impedance matcher and (ii) a second end electrically coupled to the transceiver.

18. The transceiver system of claim 17, wherein the impedance matcher is an impedance matching network comprising one or more components configured to cause a match between an antenna impedance at the magnetostrictive/piezoelectric ME composite element and a transceiver impedance at the transceiver.

19. The transceiver system of claim 17, wherein the impedance matcher is a configuration of the first and second electrically conductive contacts tailored to cause match between an antenna impedance at magnetostrictive/piezoelectric ME composite element and a transceiver impedance at the transceiver.

20. The transceiver system of claim 17, wherein the SMR-based ME antenna exhibits a symmetric directional antenna gain pattern.

* * * * *

UNITED STATES PATENT AND TRADEMARK OFFICE
CERTIFICATE OF CORRECTION

PATENT NO. : 12,072,396 B2
APPLICATION NO. : 17/656761
DATED : August 27, 2024
INVENTOR(S) : Nian-Xiang Sun et al.

It is certified that error appears in the above-identified patent and that said Letters Patent is hereby corrected as shown below:

In the Claims

In Claim 16, Column 12, Line 39:
Delete "Q·cm." and insert -- Ω·cm. --.

Signed and Sealed this
Twenty-second Day of October, 2024

Katherine Kelly Vidal
*Director of the United States Patent and Trademark Office*